(12) United States Patent
Sharpe-Geisler et al.

(10) Patent No.: US 10,141,917 B2
(45) Date of Patent: Nov. 27, 2018

(54) MULTIPLE MODE DEVICE IMPLEMENTATION FOR PROGRAMMABLE LOGIC DEVICES

(71) Applicant: Lattice Semiconductor Corporation, Hillsboro, OR (US)

(72) Inventors: Brad Sharpe-Geisler, San Jose, CA (US); Senani Gunaratna, Los Gatos, CA (US); Ting Yew, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 15/658,356

(22) Filed: Jul. 24, 2017

(65) Prior Publication Data

US 2017/0324401 A1 Nov. 9, 2017

Related U.S. Application Data

(63) Continuation of application No. 14/610,127, filed on Jan. 30, 2015, now Pat. No. 9,716,491.

(60) Provisional application No. 62/028,441, filed on Jul. 24, 2014.

(51) Int. Cl.
| | |
|---|---|
| *H03K 19/173* | (2006.01) |
| *H03K 3/3562* | (2006.01) |
| *G06F 17/50* | (2006.01) |
| *H03K 19/177* | (2006.01) |
| *H03K 3/356* | (2006.01) |
| *H03K 19/00* | (2006.01) |

(52) U.S. Cl.
CPC ....... *H03K 3/35625* (2013.01); *G06F 17/505* (2013.01); *G06F 17/5054* (2013.01); *H03K 3/356156* (2013.01); *H03K 19/0016* (2013.01); *H03K 19/173* (2013.01); *H03K 19/17728* (2013.01)

(58) Field of Classification Search
CPC ........... H03K 19/197; H03K 19/17728; H03K 19/0016; H03K 3/35625; H03K 3/356156; G06F 17/505; G06F 17/5054
USPC .......................................................... 326/38
See application file for complete search history.

(56) References Cited

U.S. PATENT DOCUMENTS

| | | |
|---|---|---|
| 5,991,908 A | 11/1999 | Baxter et al. |
| 6,367,059 B1 | 4/2002 | Becker |
| 6,798,240 B1 | 9/2004 | Pedersen |
| 6,961,741 B2 | 11/2005 | Swami |
| 7,061,268 B1 | 6/2006 | Lee et al. |
| 7,185,035 B1 | 2/2007 | Lewis et al. |
| 7,256,613 B1 | 8/2007 | Sharpe-Geisler et al. |
| 7,375,552 B1 | 5/2008 | Young et al. |

(Continued)

Primary Examiner — Don Le
(74) Attorney, Agent, or Firm — Haynes and Boone, LLP (57) ABSTRACT

Various techniques are provided to efficiently implement user designs in programmable logic devices (PLDs). In one example, a programmable logic device (PLD) includes a plurality of programmable logic blocks (PLBs) and at least first and second logic cells within at least one of the PLBs, where each logic cell includes a lookup table (LUT) and associated mode logic configured to receive a LUT output signal from the LUT. The associated mode logic is configured to use a single physical signal output to provide a logic cell output signal corresponding to a selected logic function operational mode, ripple arithmetic operational mode, or extended logic function operational mode for each logic cell.

20 Claims, 8 Drawing Sheets

(56) References Cited

U.S. PATENT DOCUMENTS

| | | | |
|---|---|---|---|
| 7,406,134 B1 * | 7/2008 | Esposito | H03D 7/166 |
| | | | 375/308 |
| 7,880,499 B2 | 2/2011 | Manohar et al. | |
| 8,072,238 B1 | 12/2011 | Hutton | |
| 8,704,548 B1 * | 4/2014 | Hutton | H03K 19/17736 |
| | | | 326/38 |
| 9,098,694 B1 | 8/2015 | Moss | |
| 2005/0062498 A1 | 3/2005 | New et al. | |
| 2007/0241780 A1 * | 10/2007 | Teig | H03K 19/17756 |
| | | | 326/40 |

\* cited by examiner

MULTIPLE MODE DEVICE IMPLEMENTATION FOR PROGRAMMABLE LOGIC DEVICES

CROSS-REFERENCE TO RELATED APPLICATIONS

This patent application is a continuation of U.S. patent application Ser. No. 14/610,127 filed Jan. 30, 2015, which claims priority to and the benefit of U.S. Provisional Patent Application 62/028,441 filed Jul. 24, 2014, all of which are hereby incorporated by reference in their entirety.

TECHNICAL FIELD

The present invention relates generally to programmable logic devices and, more particularly, to gate-level arrangements implemented in such devices.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources (e.g., programmable logic gates, look-up tables (LUTs), embedded hardware, or other types of resources) and interconnections available in particular PLDs. Physical placement and routing for the synthesized and mapped user designs may then be determined to generate configuration data for the particular PLDs.

Two primary types of configurable resources of a PLD include programmable logic blocks (PLBs) and routing resources. The logic blocks typically include a number of logic cells each containing a LUT and a register with some additional logic. The routing resources flexibly connect the logic blocks and/or cells to one another and can constitute greater than 65% of the area of the PLD, can consume most of the available power, and can take up most of a timing budget associated with a particular user design. In some cases, greater than 80% of the configuration bit cells (e.g., programmable memory) are used for routing. As such, routing limitations restrict PLB utilization. PLB utilization can be improved by increasing the amount of available routing resources, but such increases consume more area.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

In accordance with embodiments set forth herein, techniques are provided to efficiently implement user designs in programmable logic devices (PLDs). In various embodiments, a user design may be converted into and/or represented by a set of PLD components (e.g., configured for logic, arithmetic, or other hardware functions) and their associated interconnections available in a PLD. For example, a PLD may include a number of programmable logic blocks (PLBs), each PLB including a number of logic cells, and configurable routing resources that may be used to interconnect the PLBs and/or logic cells. In some embodiments, each PLB may be implemented with between 2 and 16 or between 2 and 32 logic cells.

In various embodiments, PLB utilization in a PLD can be improved by increasing the flexibility of the PLBs, logic cells, and/or routing resources to allow for additional degrees of freedom in the routing when implementing a particular user design. Such additional degrees of freedom may allow a larger number of PLBs to be serviced by a smaller selection of routing resources, as compared to conventional PLD implementations.

In general, a PLD (e.g., an FPGA) fabric includes one or more routing structures and an array of similarly arranged logic cells arranged within programmable function blocks (e.g., PFBs and/or PLBs). The purpose of the routing structures is to programmably connect the ports of the logic cells/PLBs to one another in such combinations as necessary to achieve an intended functionality. The routing structures account for most of the area, power, and delay of the fabric. The goal in designing a particular type of PLD is to maximize functionality while minimizing area, power, and delay of the fabric.

One approach is to increase the functionality of the logic cells and/or PLBs. There have been recent trends to go from four input look-up table structures (4-LUTs) to 6-LUTs as the basic function block (e.g., within a logic cell) of the fabric. A 6-LUT has two more input ports than a 4-LUT (which increases the general burden on routing) yet offers more function flexibility, thereby allowing more logic to be packed into each logic cell. In typical usage, a 6-LUT may pack 1.5× to 2× the logic capability of a 4-LUT, but it typically also consumes four times the area. Such 6-LUT structures can provide some advantages in speed (e.g., operations completed per second), but can present a liability in overall area and power usage.

Another approach is to provide a multiple mode or convertible logic cell, where a single logic cell may be implemented with mode logic that allows the logic cell to operate according to multiple different operational or output modes, as described herein. For example, such logic cell may be configured to operate according to a logic function mode, where an output of the logic cell may depend primarily on a logic function implemented within a LUT of the logic cell. Such logic cell may also be configured to operate according to a ripple arithmetic mode, where an output of the logic cell may depend on a ripple sum implemented with a LUT of the logic cell and associated carry logic configured to accept carry-in values and provide carry-out values, for example. Such logic cell may also be configured to operate as a RAM memory with independent read and write ports. Such logic cell may also be configured to operate according to an extended logic function mode, where an output of the logic cell may depend on an extended logic function implemented within multiple LUTs of multiple logic cells, as described herein.

In some embodiments, a logic cell may be implemented with a separate extended logic or "OFX" output port and a separate function and/or sum or "FS" output port. "F" may be the direct output of the 4-LUT in logic function mode. "S" may the SUM in ripple arithmetic mode that uses the LUT (with generate and propagate registers and/or signals) along with carry logic downstream of the LUT, as described herein. There may also be a separate and/or interconnected register output "Q" for each LUT and/or logic cell.

Figure 4:
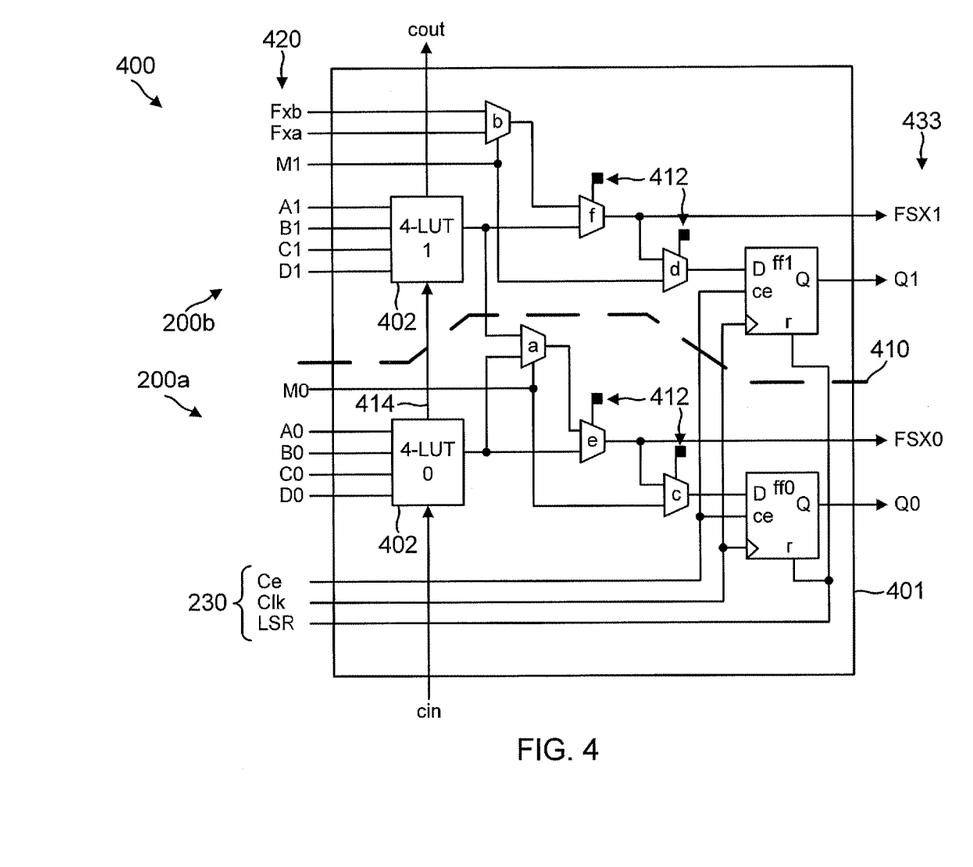
FIG. 4 illustrates a block diagram of multiple mode logic cells for a PLD in accordance with an embodiment of the disclosure.

As described with more detail in relation with FIG. 4, multiple logic cells, which in some embodiments may be adjacent logic cells arranged in a PLB, may be arranged in interconnected groups sometimes referred to as slices. Interconnections between logic cells in a slice may be hardwired, for example, may be programmably implemented with routing resources, or may be implemented with a combination of hardwired and configurable routing resources, as described herein. Slices may include two, three, four, or more logic cells, for example, and one or more slices may be implemented entirely or partially within a PLB.

In various embodiments, slices including multiple mode or convertible logic cells may be implemented with inputs and outputs sufficient to allow two logic cells with constituent n-LUTs to be operated together to provide a higher order LUT (e.g., an (n+1)-LUT). In embodiments where the slice consists of two multiple mode logic cells implemented with separate OFX and FS ports, the OFX port of the first logic cell may be referred to as OFX0 and the OFX port of the second logic cell as OFX1, and similarly with the FS0 and FS1 ports.

For example, in embodiments where the two multiple mode logic cells in the slice each include a 4-LUT, the OFX0 output signal corresponds to the two 4-LUT output signals combined with a 2:1 multiplexer (mux) to make a 5-LUT, where the select port of the 2:1 mux corresponds to the fifth LUT input of the 5-LUT (e.g., designated M0, as described herein). In various embodiments, the OFX1 output signal provides a means for creating higher order LUTs (e.g., 6-LUTs, 7-LUTs, and/or higher order LUTs) in a similar way. One can combine two 5-LUTs to make a 6-LUT, or combine two 6-LUTs to make a 7-LUT.

In such slice embodiments, there may be six outputs (e.g., FS0, OFX0, Q0, FS1, OFX1, Q1, three from each logic cell) from each slice to the routing resources. This has the benefit of offering the capability of higher order LUTs, but includes the disadvantage of additional ports (e.g., relative to logic cells with FS ports only), which are a greater burden on the routing resources.

Area, power, and delay of the routing resources can be reduced by simplifying the routing necessary to provide the general flexibility and functionality of the related multiple mode logic cells.

In accordance with embodiments described herein, one technique to improve PLB utilization and reduce routing resource burden is to combine the FS and OFX ports into a single "FSX" port to reduce the number of necessary ports while preserving desired functionality and performance. Slices implemented with such multiple mode logic cells then may only have four (e.g., rather than 6) outputs (FSX0, Q0, FSX1, Q1, two from each logic cell) to the routing resources, thus facilitating simplification and reduction of the burden on the routing resources. In various embodiments, the FSX output functionality may be implemented so that no additional delay is incurred when an FS mode is selected (e.g., a logic function mode, or a ripple arithmetic mode), which would otherwise be the case if an additional 2:1 MUX were inserted into the output path from corresponding FS and OFX outputs.

In addition, in some embodiments, each register output Q may advantageously be coupled to latch either a corresponding FSX output or a logic cell input, for example, as selected by a control bit or register. In various embodiments, the latched logic cell input may be an input separate from the LUT inputs for the logic cell. This allows each logic cell to programmably provide latch functionality that can be completely separate from a selected mode for that logic cell and/or the logic, ripple arithmetic, and/or extended logic function the logic cell is programmed to implement, as described herein. Such functionality can be beneficial when routing signals across portions of a PLD, for example, because registers can be used to compensate for signal propagation delays related to the routing and/or processing of signals along a signal path, such as in a buffered synchronous pipeline arrangement. Flexibility in placement of such registers/latches (e.g., and their associated non-LUT tied inputs) throughout a user design (e.g., by adjusting placement of logic cells programmed to be in an operational mode allowing for segregated register functionality) can help increase PLD utilization and optimize speed of the user design.

The increased routing flexibility and configurable function embedding may be used when synthesizing, mapping, placing, and/or routing a user design into a corresponding reduced number of PLD components. As a result of such process (e.g., optimization based on multiple mode or convertible logic cell flexibility), a user design can be implemented relatively efficiently, thereby freeing up the configurable PLD components that would otherwise be occupied by additional operations and routing resources. Furthermore, the propagation delay of the resulting user design may also be reduced, which in some cases may advantageously permit an increase in the clock frequency of a PLD configured with the user design. In some embodiments, the optimized user design may be represented by a netlist that identifies various types of components provided by the PLD and their associated signals. In embodiments that produce a netlist of the converted user design, the optimization process may be performed on such a netlist.

Figure 1:
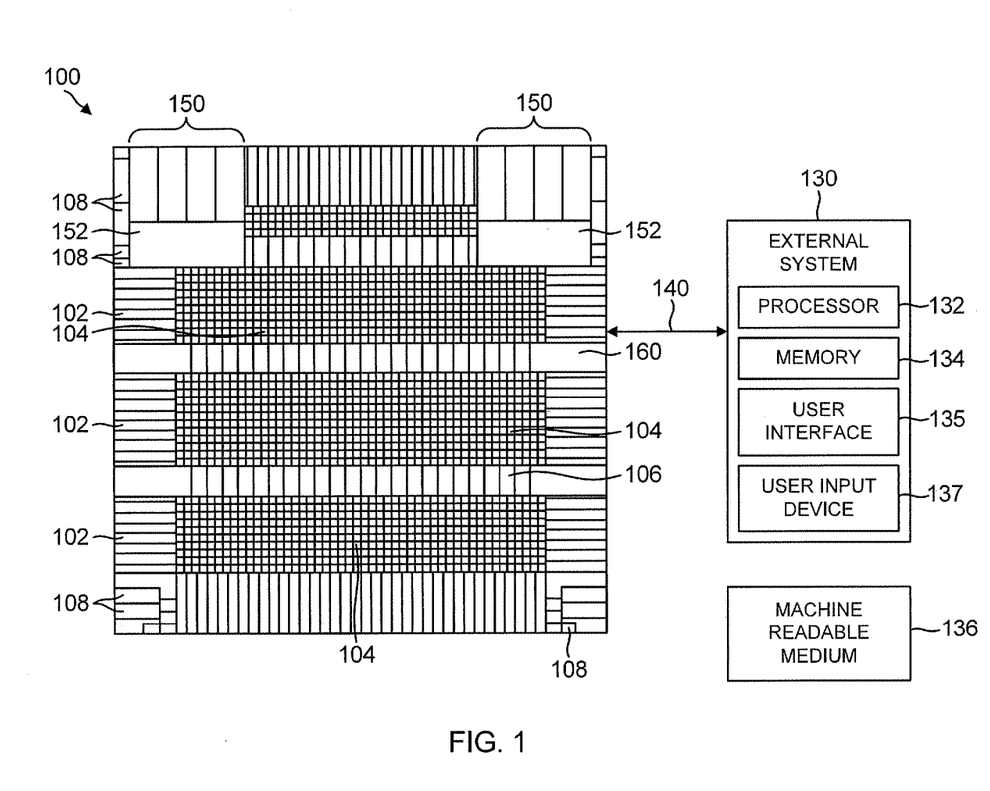
FIG. 1 illustrates a block diagram of a programmable logic device (PLD) in accordance with an embodiment of the disclosure.

Referring now to the drawings, FIG. 1 illustrates a block diagram of a PLD 100 in accordance with an embodiment of the disclosure. PLD 100 (e.g., a field programmable gate array (FPGA)), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)).

I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100. Additional I/O functionality may be provided by serializer/deserializer (SERDES) blocks 150 and physical coding sublayer (PCS) blocks 152. PLD 100 may also include hard intellectual property core (IP) blocks 160 to provide additional functionality (e.g., substantially predetermined functionality provided in hardware which may be configured with less programming than logic blocks 104).

PLD 100 may also include blocks of memory 106 (e.g., blocks of EEPROM, block SRAM, and/or flash memory), clock-related circuitry 108 (e.g., clock sources, PLL circuits, and/or DLL circuits), and/or various routing resources 180 (e.g., interconnect and appropriate switching logic to provide paths for routing signals throughout PLD 100, such as for clock signals, data signals, or others) as appropriate. In general, the various elements of PLD 100 may be used to perform their intended functions for desired applications, as would be understood by one skilled in the art.

For example, certain I/O blocks 102 may be used for programming memory 106 or transferring information (e.g., various types of user data and/or control signals) to/from PLD 100. Other I/O blocks 102 include a first programming port (which may represent a central processing unit (CPU) port, a peripheral data port, an SPI interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, I/O blocks 102 may be included to receive configuration data and commands (e.g., over one or more connections 140) to configure PLD 100 for its intended use and to support serial or parallel device configuration and information transfer with SERDES blocks 150, PCS blocks 152, hard IP blocks 160, and/or logic blocks 104 as appropriate.

It should be understood that the number and placement of the various elements are not limiting and may depend upon the desired application. For example, various elements may not be required for a desired application or design specification (e.g., for the type of programmable device selected).

Furthermore, it should be understood that the elements are illustrated in block form for clarity and that various elements would typically be distributed throughout PLD 100, such as in and between logic blocks 104, hard IP blocks 160, and routing resources (e.g., routing resources 180 of FIG. 2) to perform their conventional functions (e.g., storing configuration data that configures PLD 100 or providing interconnect structure within PLD 100). It should also be understood that the various embodiments disclosed herein are not limited to programmable logic devices, such as PLD 100, and may be applied to various other types of programmable devices, as would be understood by one skilled in the art.

An external system 130 may be used to create a desired user configuration or design of PLD 100 and generate corresponding configuration data to program (e.g., configure) PLD 100. For example, system 130 may provide such configuration data to one or more I/O blocks 102, SERDES blocks 150, and/or other portions of PLD 100. As a result, programmable logic blocks 104, various routing resources, and any other appropriate components of PLD 100 may be configured to operate in accordance with user-specified applications.

In the illustrated embodiment, system 130 is implemented as a computer system. In this regard, system 130 includes, for example, one or more processors 132 which may be configured to execute instructions, such as software instructions, provided in one or more memories 134 and/or stored in non-transitory form in one or more non-transitory machine readable mediums 136 (e.g., which may be internal or external to system 130). For example, in some embodiments, system 130 may run PLD configuration software, such as Lattice Diamond System Planner software available from Lattice Semiconductor Corporation to permit a user to create a desired configuration and generate corresponding configuration data to program PLD 100.

System 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of PLD 100.

Figure 2:
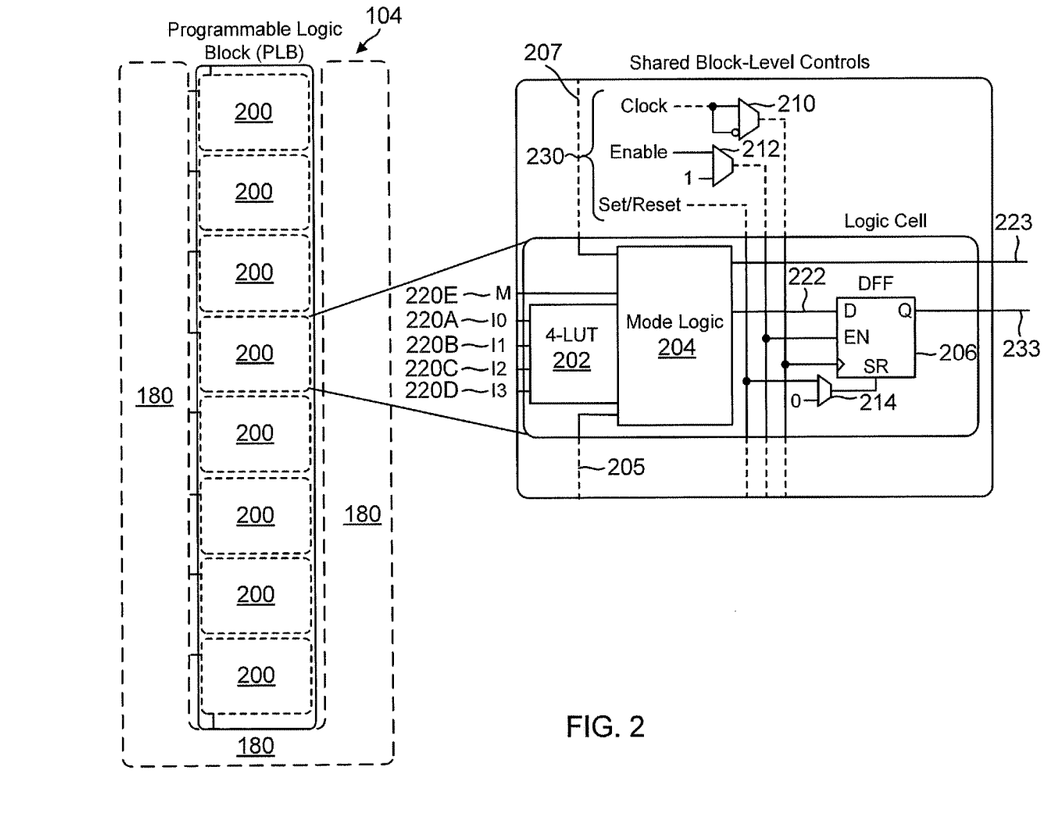
FIG. 2 illustrates a block diagram of a logic block for a PLD in accordance with an embodiment of the disclosure.

FIG. 2 illustrates a block diagram of a logic block 104 of PLD 100 in accordance with an embodiment of the disclosure. As discussed, PLD 100 includes a plurality of logic blocks 104 including various components to provide logic and arithmetic functionality.

In the example embodiment shown in FIG. 2, logic block 104 includes a plurality of logic cells 200, which may be interconnected internally within logic block 104 and/or externally using routing resources 180. For example, each logic cell 200 may include various components such as: a lookup table (LUT) 202, a mode logic circuit 204, a register 206 (e.g., a flip-flop or latch), and various programmable multiplexers (e.g., programmable multiplexers 212 and 214) for selecting desired signal paths for logic cell 200 and/or between logic cells 200. In this example, LUT 202 accepts four inputs 220A-220D, which makes it a four-input LUT (which may be abbreviated as "4-LUT" or "LUT4") that can be programmed by configuration data for PLD 100 to implement any appropriate logic operation having four inputs or less. Mode Logic 204 may include various logic elements and/or additional inputs, such as input 220E, to support the functionality of the various modes, as described herein. LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from LUT 202 and/or mode logic 204 may in some embodiments be passed through register 206 to provide an output signal 233 of logic cell 200. In various embodiments, an output signal 223 from LUT 202 and/or mode logic 204 may be passed to output 223 directly, as shown. Depending on the configuration of multiplexers 210-214 and/or mode logic 204, output signal 222 may be temporarily stored (e.g., latched) in latch 206 according to control signals 230. In some embodiments, configuration data for PLD 100 may configure output 223 and/or 233 of logic cell 200 to be provided as one or more inputs of another logic cell 200 (e.g., in another logic block or the same logic block) in a staged or cascaded arrangement (e.g., comprising multiple levels) to configure logic operations that cannot be implemented in a single logic cell 200 (e.g., logic operations that have too many inputs to be implemented by a single LUT 202). Moreover, logic cells 200 may be implemented with multiple outputs and/or interconnections to facilitate selectable modes of operation, as described herein.

Mode logic circuit 204 may be utilized for some configurations of PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, mode logic circuits 204, across multiple logic cells 202, may be chained together to pass carry-in signals 205 and carry-out signals 207, and/or other signals (e.g., output signals 222) between adjacent logic cells 202, as described herein. In the example of FIG. 2, carry-in signal 205 may be passed directly to mode logic circuit 204, for example, or may be passed to mode logic circuit 204 by configuring one or more programmable multiplexers, as described herein. In some embodiments, mode logic circuits 204 may be chained across multiple logic blocks 104. More detailed embodiments are provided in FIGS. 4-7.

Logic cell 200 illustrated in FIG. 2 is merely an example, and logic cells 200 according to different embodiments may include different combinations and arrangements of PLD components. Also, although FIG. 2 illustrates logic block 104 having eight logic cells 200, logic block 104 according to other embodiments may include fewer logic cells 200 or more logic cells 200. Each of the logic cells 200 of logic block 104 may be used to implement a portion of a user design implemented by PLD 100. In this regard, PLD 100 may include many logic blocks 104, each of which may include logic cells 200 and/or other components which are used to collectively implement the user design.

As further described herein, portions of a user design may be adjusted to occupy fewer logic cells 200, fewer logic blocks 104, and/or with less burden on routing resources 180 when PLD 100 is configured to implement the user design. Such adjustments according to various embodiments may identify certain logic, arithmetic, and/or extended logic operations, to be implemented in an arrangement occupying multiple embodiments of logic cells 200 and/or logic blocks 104. As further described herein, an optimization process may route various signal connections associated with the arithmetic/logic operations described herein, such that a logic, ripple arithmetic, or extended logic operation may be implemented into one or more logic cells 200 and/or logic blocks 104 to be associated with the preceding arithmetic/logic operations.

Figure 3:
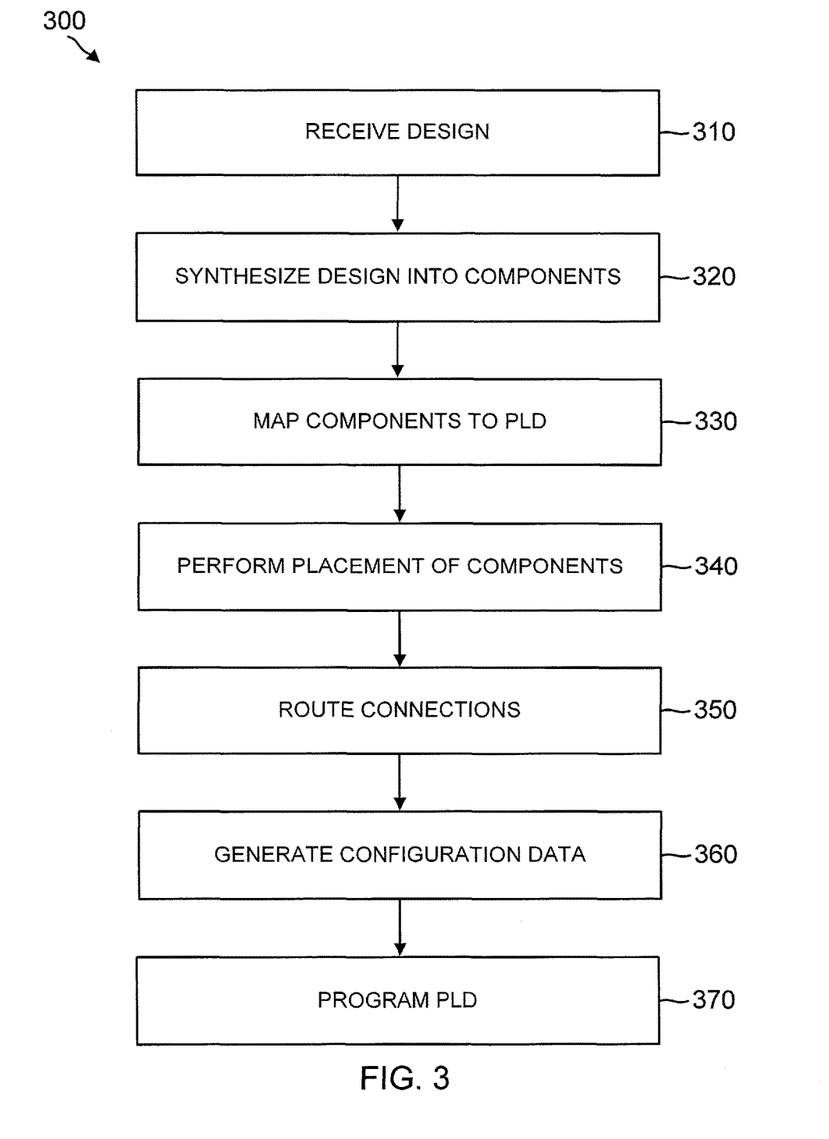
FIG. 3 illustrates a design process for a PLD in accordance with an embodiment of the disclosure.

FIG. 3 illustrates a design process 300 for a PLD in accordance with an embodiment of the disclosure. For example, the process of FIG. 3 may be performed by system 130 running Lattice Diamond software to configure PLD 100. In some embodiments, the various files and information referenced in FIG. 3 may be stored, for example, in one or more databases and/or other data structures in memory 134, machine readable medium 136, and/or otherwise.

In operation 310, system 130 receives a user design that specifies the desired functionality of PLD 100. For example, the user may interact with system 130 (e.g., through user input device 137 and hardware description language (HDL) code representing the design) to identify various features of the user design (e.g., high level logic operations, hardware configurations, and/or other features). In some embodiments, the user design may be provided in a register transfer level (RTL) description (e.g., a gate level description). System 130 may perform one or more rule checks to confirm that the user design describes a valid configuration of PLD 100. For example, system 130 may reject invalid configurations and/or request the user to provide new design information as appropriate.

In operation 320, system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 320 may involve converting (e.g., translating) the high-level description of logic operations, hardware configurations, and/or other features in the user design into a set of PLD components (e.g., logic blocks 104, logic cells 200, and other components of PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 320 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In another example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

In operation 330, system 130 performs a mapping process that identifies components of PLD 100 that may be used to implement the user design. In this regard, system 130 may map the optimized netlist (e.g., stored in operation 320 as a result of the optimization process) to various types of components provided by PLD 100 (e.g., logic blocks 104, logic cells 200, embedded hardware, and/or other portions of PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 320 to produce a netlist that is mapped to PLD components.

In operation 340, system 130 performs a placement process to assign the mapped netlist components to particular physical components residing at specific physical locations of the PLD 100 (e.g., assigned to particular logic cells 200, logic blocks 104, routing resources 180, and/or other physical components of PLD 100), and thus determine a layout for the PLD 100. In some embodiments, the placement may be performed on one or more previously-stored NCD files, with the placement results stored as another physical design file.

In operation 350, system 130 performs a routing process to route connections (e.g., using routing resources 180) among the components of PLD 100 based on the placement layout determined in operation 340 to realize the physical interconnections among the placed components. In some embodiments, the routing may be performed on one or more previously-stored NCD files, with the routing results stored as another physical design file.

In various embodiments, routing the connections in operation 350 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

In some embodiments, the optimization process may include optimizing certain instances of a logic function operation, a ripple arithmetic operation, and/or an extended logic function operation which, when a PLD is configured to implement the user design, would occupy a plurality of configurable PLD components (e.g., logic cells 200, logic blocks 104, and/or routing resources 180). For example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to reduce the number of PLD components and/or routing resources used to implement the operations and/or to reduce the propagation delay associated with the operations, and/or reprogramming corresponding LUTs and/or mode logic to account for the interchanged operational modes.

In another example, the optimization process may include detecting extended logic function operations and/or corresponding routing resources in the user design, implementing the extended logic operations into multiple mode or convertible logic cells with single physical logic cell outputs, routing or coupling the logic cell outputs of a first set of logic cells to the inputs of a second set of logic cells to reduce the number of PLD components used to implement the extended logic operations and/or routing resources and/or to reduce the propagation delay associated with the extended logic operations, and/or programming corresponding LUTs and/or mode logic to implement the extended logic function operations with at least the first and second sets of logic cells.

In another example, the optimization process may include detecting multiple mode or configurable logic cells implementing logic function operations, ripple arithmetic operations, extended logic function operations, and/or corresponding routing resources in the user design, interchanging operational modes of logic cells implementing the various operations to provide a programmable register along a signal path within the PLD to reduce propagation delay associated with the signal path, and reprogramming corresponding LUTs, mode logic, and/or other logic cell control bits/registers to account for the interchanged operational modes and/or to program the programmable register to store or latch a signal on the signal path.

Changes in the routing may be propagated back to prior operations, such as synthesis, mapping, and/or placement, to further optimize various aspects of the user design.

Thus, following operation 350, one or more physical design files may be provided which specify the user design after it has been synthesized (e.g., converted and optimized), mapped, placed, and routed (e.g., further optimized) for PLD 100 (e.g., by combining the results of the corresponding previous operations). In operation 360, system 130 generates configuration data for the synthesized, mapped, placed, and routed user design. In operation 370, system 130 configures PLD 100 with the configuration data by, for example, loading a configuration data bitstream into PLD 100 over connection 140.

FIG. 4 illustrates a block diagram 400 of multiple mode logic cells 200a, 200b arranged in a sub-block or slice 401 for a PLD, in accordance with an embodiment of the disclosure. In various embodiments, sub-block/slice 401 may include two or more multiple mode logic cells 200a, 200b (e.g., shown functionally differentiated by dashed line 410) configured to accept inputs 420 and provide outputs 433.

Input signals A0-D0 are the inputs of 4-LUT0, and input signals A1-D1 are the inputs for 4-LUT1. The LUT output signal for 4-LUT0 (e.g., exiting the right of 4-LUT0) may correspond to FS0, while the LUT output signal for 4-LUT1 (e.g., exiting the right of 4-LUT1) may correspond to FS1, as described herein. Mux "a" may be implemented as a 2:1 mux controlled by input signal M0 to select either FS0 or FS1 to generate an output signal corresponding to OFX0. If the input signals A0=A1, B0=B1, C0=C1, and D0=D1, then FSX0 may correspond to the output signal for a 5-LUT, where the 5th input signal is M0. In the embodiment shown in FIG. 4, OFX1 may correspond to the 2:1 mux combination at mux "b" of input signals Fxa and Fxb controlled by input M1.

2:1 mux "e" may be configured to programmably select either the signal out of 2:1 mux "a" (e.g., corresponding to OFX0) or the LUT output signal of 4-LUT0 (e.g., corresponding to FS0) to create output signal FSX0. Such programming may be provided by one or more control bits/registers 412 and/or associated logic, as described in more detail in FIGS. 6-7. Similarly, 2:1 mux "f" may be configured to programmably select (e.g., as may also be provided by control bits/registers 412) either the signal out of 2:1 mux "b" (e.g., corresponding to OFX1) or the output of 4-LUT1 (e.g., corresponding to FS1) to create signal FSX1.

In addition, in some embodiments, multiple mode logic cell 200a may include 2:1 mux "c", which may be configured to programmably select (e.g., as provided by control bits/registers 412) either input signal M0 or signal FSX0 and provide the selected signal to register ff0, and multiple mode logic cell 200b may include 2:1 mux "d", which may be configured to programmably select (e.g., as provided by control bits/registers 412) either input signal M1 or signal FSX1 and provide the selected signal to register ff0. As described herein, this functionality allows either or both multiple mode logic cells to be programmed to latch outputs FSX0 and/or FSX1 or to provide pass-through latch functionality with respect to inputs M0 and/or M0. This flexibility can be used to optimize placement of logic cells within a PLD.

The disclosed arrangement reduces the outputs from logic cells 200a and 200b of slice 401 (e.g., to routing resources 180 of FIG. 2) from six to four. In some embodiments, each PLB may include four slices, and so the total outputs per PLB may be reduced from twenty-four to sixteen. Also, although FIG. 4 includes carry input signal cin and carry output signal cout for slice 401, and trace 414 coupling corresponding carry in and carry out ports for logic cells 200a, 200b, respectively, in various embodiments, such carry signals and ports may be implemented in mode logic (e.g., mode logic 204 of FIG. 2) and not be interconnected directly to LUTs of logic cells 200a, 200b.

Figure 5:
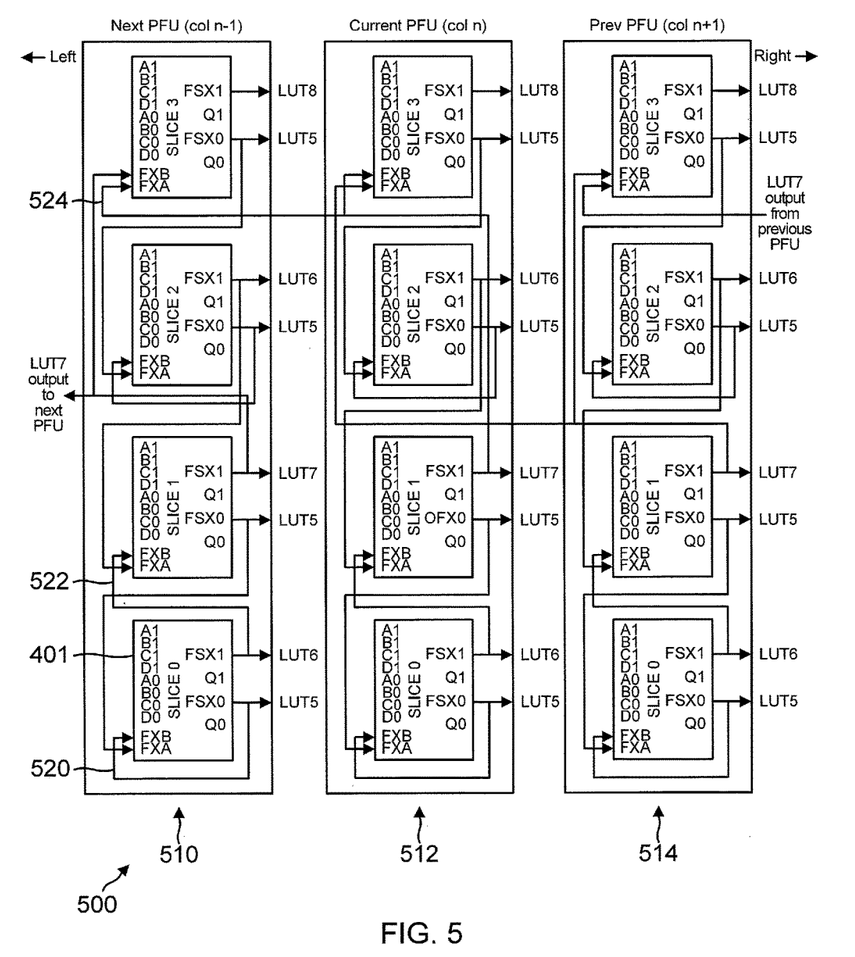
FIG. 5 illustrates a block diagram of multiple mode logic cells for a PLD in accordance with an embodiment of the disclosure.

FIG. 5 illustrates a block diagram 500 of multiple mode logic cells (e.g., in the form of slices 401) for a PLD in accordance with an embodiment of the disclosure. As shown in diagram 400, slices 401 may be arranged in PFUs and/or PFDs corresponding to columns 510, 512, 514, where slices within PLBs/PFUs may be interconnected to themselves over routings 520 and/or to each other over routings 522, and/or slices in different PLBs/PFUs may also be interconnected over routings 524, such as to form higher order LUTs and/or to implement other extended logic functions, for example. In some embodiments, routings 520, 522, and/or 524 may be implemented with hardwired routings, for example, or may be implemented with routing resources 180 and/or a combination of hardwired and/or configurable routing resources.

In various embodiments routings 520, 522, and/or 524 illustrate connections from logic cell FSX0 and FSX1 outputs of slices 401 to logic cell Fxa and Fxb inputs of slices 401 to construct 6-LUTs, 7-LUTs, and 8-LUTs using multiple slices, where input pin M1 (e.g., not explicitly shown in FIG. 5) may be configured to provide the sixth LUT input when an associated FSX1 is configured to provide a 6-LUT output signal based on multiple slices of multiple logic cells (e.g., and similarly for a 7-LUT and/or an 8-LUT, as shown). Although diagram 500 illustrates an arrangement of logic cells, slices, and PLBs configured to minimize the routing and delay necessary to produce a higher order LUT output signal using logic from multiple individual logic cells (e.g., thereby implementing an extended logic function), other interconnection arrangements are contemplated, such as arrangements minimizing signal traversal of PLB boundaries (e.g., corresponding to columns 510, 512, 514), and/or minimizing signal traversal between more than two PLBs, for example.

Figure 6:
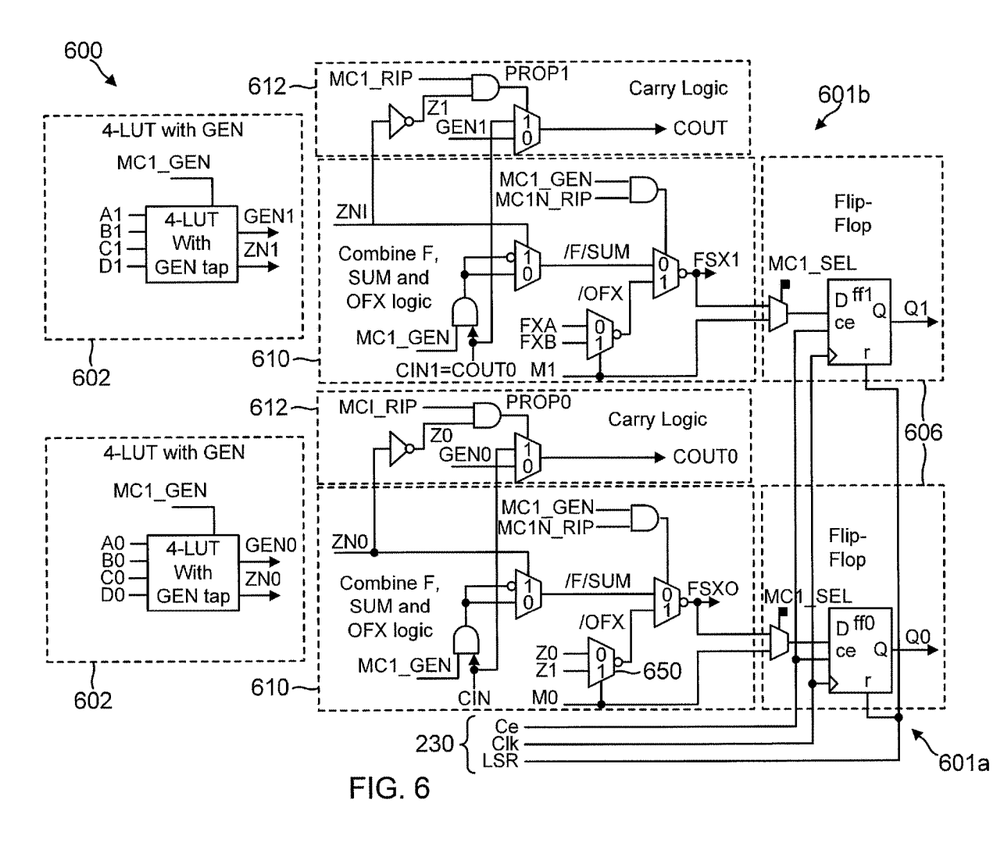
FIG. 6 illustrates a block diagram of multiple mode logic cells for a PLD in accordance with an embodiment of the disclosure.

FIG. 6 illustrates a block diagram 600 of two multiple mode logic cells 601a, 601b arranged in a two-cell slice for a PLD, in accordance with an embodiment of the disclosure. In some embodiments, similar structures, formed from two or more interconnected multiple mode logic cells for example, may be referred to as a multiple mode slice.

As shown in diagram 600, each logic cell may be implemented with a 4-LUT 602, which may be configured to accept a generate control signal from a generate register (e.g., MC1_GEN) and provide a generate signal (e.g., GEN0 or GEN1). Such generate signals may be used, along with combine logic 610 and carry logic 612, to facilitate a ripple arithmetic mode. In some embodiments, 4-LUT 602 and/or at least portions of combine logic 610 and/or carry logic 612 may be implemented according to any of the systems and methods described in U.S. patent application Ser. No. 14/610,074, filed Jan. 30, 2015 and entitled "FLEXIBLE RIPPLE MODE DEVICE IMPLEMENTATION FOR PROGRAMMABLE LOGIC DEVICES" which is hereby incorporated by reference in its entirety.

In various embodiments, combine logic 610 and carry logic 612 may be referred to together as mode logic (e.g., mode logic 204 of FIG. 2), which may be configured to implement multiple modes of operation for logic cells 601a and 601b and use a single physical output port (e.g., designated FSX0 for logic cell 601a, and FSX1 for logic cell 601b) to provide logic cell output signals corresponding to a selected operational mode for each logic cell, as described herein. In some embodiments, logic cells 601a, 601b may be implemented without carry logic 612, for example, and combine logic 610 by itself may correspond to mode logic 204 of FIG. 2. As such, mode logic for multiple mode logic cells 601a, 601b may be implemented with three or four 2:1 muxs, and without any reliance on 3:1 muxs (e.g., which typically would substantially increase area needed to implement such mode logic).

As shown in FIG. 6, each logic cell may be implemented with programmable flip flop or latch 606, similar to register 205 of FIG. 2, which may be used to programmably store and/or forward an FSX output or an M input, for example. In some embodiments, the selection of FSX output or M input may be programmably selected by a select register (e.g., MC1_SEL), such that the functionality of programmable register 606 is selected when the PLD is programmed.

In the embodiment shown in FIG. 6, although different signals are routed to and from combine logic 610 and carry logic 612 (e.g., mode logic 204) for logic cells 601a and 601b, the basic structure is substantially the same and therefore repeatable over a number of different logic cell structures within a PLD, thereby facilitating manufacture of the PLD by reducing associated testing and/or validation steps that would otherwise generally need to be repeated for each different type of logic cell implemented in a particular PLD. Also, as shown in diagram 600, the mode logic of logic cells 601a, 601b (e.g., combine logic 610 and/or carry logic 612) may be configured to use the same control registers (e.g., generate and ripple registers) used to enable and disable ripple mode arithmetic to enable and disable three modes of operation for logic cells 601a, 601b, thereby eliminating a need to use additional PLD resources to select a particular operational mode for logic cells 601a, 601b.

Figure 7:
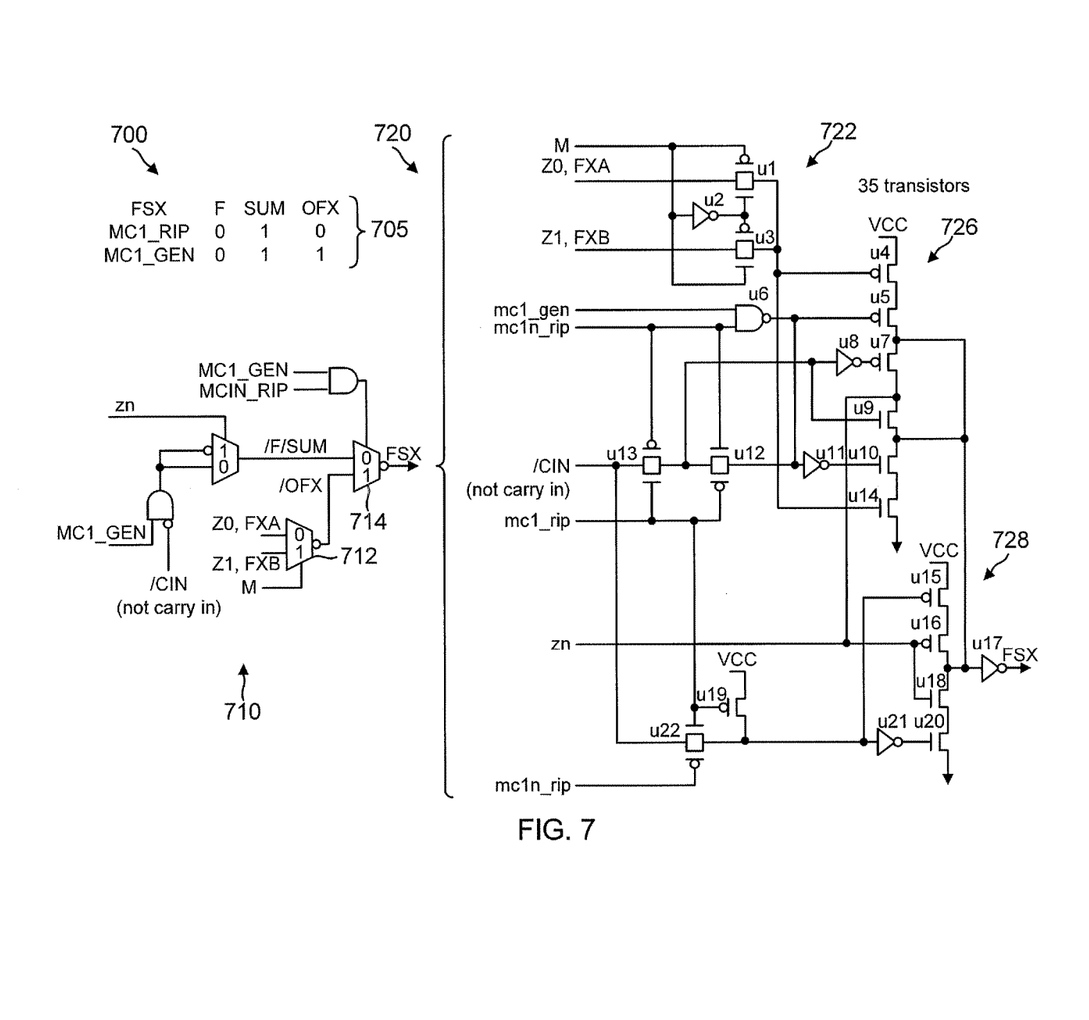
FIG. 7 illustrates a block diagram of mode logic for a multi-mode logic cell implemented in a PLD in accordance with an embodiment of the disclosure.

In some embodiments, mode logic for multiple mode logic cells (e.g., combine logic 610) may be implemented to minimize signal propagation delay in providing output signal FSX, particularly when a logic cell is configured to provide a logic function output signal (e.g., "F" of "FSX") that has no interdependency with other logic cells, as described herein. FIG. 7 illustrates a block diagram 700 of implementation details for such mode logic (e.g., combine logic 610 of FIG. 6) for a multiple mode logic cell implemented in a PLD in accordance with an embodiment of the disclosure.

In various embodiments, mode logic 710 (e.g., corresponding to combine logic 610 in FIG. 6) may be implemented to select the F, SUM, and OFX modes of operation for a logic cell. As shown in FIG. 7, diagram 700 includes truth table 705 indicating an operational mode of a logic cell implemented with mode logic 710, as selected by values for control registers MC1_GEN (e.g., a generate register) and MC1_RIP (e.g., a ripple register).

Circuitry 720 (e.g., the right hand side of FIG. 7) depicts an embodiment of mode logic 710 where the circuitry performing the OFX mux is implemented substantially in parallel with the circuitry implementing ripple logic. Such circuitry arrangement has the benefit of not introducing substantial delay to the LUT/SUM signal propagation path.

At the top of FIG. 7, 2:1 mux 722 selects between Z0/FXA and Z1/FXB, as controlled by M. The remainder of circuitry 720 is substantially controlled by the two configuration bits/control registers (mc1_gen and mc1_rip) that determine the operational mode for the associated logic cell and, thereby, the functionality of the output pin FSX to provide LUT output F, SUM, or OFX, as described herein. The following paragraphs illustrate the signal propagation according to the various selectable modes.

Mode logic 710 is in a logic function operational mode (e.g., mode F) when MC1_RIP=0 and MC1_GEN=0. From circuitry 720, this causes the output of NAND structure u6 to go high, which causes PMOS transistor structure u5 to turn off, and, through the action of inverter structure u11, also causes NMOS transistor structure u10 to turn off. MC1_RIP=0 also turns off passgate structure u13 while turning on passgate structure u12 so that the output of u6 turns on passgate structure u9, u7 while turning passgate structure u22 off and PMOS transistor structure u19 on, which turns off u15 and u20 so that only passgate structure u7, u9 drives inverter structure u17. Therefore, while circuitry 720 is in a logic function operational mode, the propagation delay between input ZN (e.g., corresponding to a LUT output) and the gate of inverter structure u17 corresponds substantially to the propagation delay of one passgate structure (e.g., passgate structure u7, u9), and output FSX is configured to output F.

Mode logic 710 is in a ripple arithmetic operational mode (e.g., ripple arithmetic mode SUM or S) when MC1_RIP=1 and MC1_GEN=1. From circuitry 710, MC1_RIP being high means MC1N_RIP is low, which causes the output of NAND structure u6 to be high, which turns off PMOS transistor structure u5 and NMOS transistor structure u10. MC1_RIP being high and MC1N_RIP being low also causes passgate structures u13 and u22 to be on while passgate structure u12 is off. This results in CIN (carry in) controlling the polarity of LUT output ZN at the gate of inverter structure u17. If CIN is low, PMOS transistor structure u15 and NMOS transistor structure u20 are on while PMOS transistor structure u7 and NMOS transistor structure u9 are off. This results in inverter structure u16, u18 being on, thereby presenting the inverted polarity of ZN at the input of inverter structure u17. Conversely, when CIN is high, inverter structure u16, u18 is current starved and off, whereas passgate structure u9, u7 is on so that the input to inverter structure u17 is presented with ZN. Therefore, while in a ripple arithmetic operational mode, and from these relationships with CIN, output FSX is configured to output ripple arithmetic output SUM.

Mode logic 710 is in an extended logic function operational mode (e.g., extended logic mode OFX) when MC1_RIP=0 and MC1_GEN=1. This causes the output of NAND structure u6 to go low, which causes PMOS transistor structure u5 to turn on and, through the action of inverter structure u11, also turns on NMOS transistor structure u10, which allows u4 and u14 to drive the input of inverter structure u17. MC1_RIP=0 also turns off passgate structure u13 while turning on passgate structure u12 so that the output of u6 turns off u9 and u7 while turning passgate structure u22 off and PMOS transistor structure u19 on, which in turn turns off u15 and u20 so that only 2:1 mux 722 (e.g., through u4 and u14) drives inverter structure u17. Therefore, while in an extended logic function operational mode in the implementation shown in FIG. 7, output FSX is configured to output extended logic output OFX.

As shown in FIG. 7 and described herein, circuitry 720 may be implemented using multiple cascades of transistor structures, such as cascades 726 and 728, which may themselves be arranged to decrease the area needed to implement mode logic 710, for example, and/or to decrease the overall capacitance and/or impedance experienced by signals passing through circuitry 720, relative to alternative transistor arrangements. Such arrangements may be configured provide these benefits while also providing the relatively minimal propagation delay for the logic cell output, as described herein. Decreasing the area used to implement mode logic 710 allows more functionality and/or flexibility to be integrated into a particular logic cell and/or PLD, and decreasing the overall capacitance of circuitry 720 increases the achievable speed of logic cells implemented with mode logic 710. In addition, decreasing the overall impedance of circuitry 720 can beneficially decrease power usage and dissipation within mode logic 710, which also generally increases the utility and achievable speed of a PLD that includes logic cells implemented with mode logic 710.

For example, in some embodiments, cascade 726 may be implemented with one PMOS active region (e.g., used to form PMOS transistor structures u4, u5, and u7) and one NMOS active region (e.g., used to form NMOS transistor structures u9, u10, and u14), and cascade 728 may also be implemented with one PMOS active region (e.g., used to form PMOS transistor structures u15 and u16) and one NMOS active region (e.g., used to form NMOS transistor structures u18 and u20). In other embodiments, due in part to the common electric connection arrangement of NMOS transistor structures u9, u10, and u14, and u18 and u20, a single NMOS active region may be used form NMOS transistor structures u9, u10, u14, u18, and u20. In such embodiments, transistor cascades 726 and 728 may therefore be implemented with just three active regions (e.g., one NMOS active region, and two PMOS active regions) formed within an integrated circuit/chip.

Using a single active region to implement multiple transistor structures can reduce the area and/or processing steps needed to fabricate a particular integrated circuit. For instance, different semiconductor active regions typically require different fabrication processing steps and/or physical separation on a chip die (e.g., particularly when the active regions are of a different N or P type), and the physical separation itself requires area (e.g., for a gap or trench or other type of physical structure used to physically and/or electrically differentiate the active areas) in addition to the area dedicated to conductive interface structures (e.g., metal layers or traces, etc.) necessary to couple semiconductor structures in different active areas to each other.

In embodiments where multiple transistor structures are formed within a common active area, the transistor structures can be formed using the same fabrication processing steps, for example, and may be electrically coupled to one another within the active area and/or share common structure without need for individual active area interface structures. This can significantly reduce both the area necessary to implement the transistor structures (e.g., into cascades 726 and/or 728) and the size and/or length of conductive interconnections (e.g., metal layers or traces) between the transistor structures. Reducing the size and/or length of the conductive interconnections helps reduce the overall capacitance of the circuit, and reducing the overall capacitance increases the circuit's achievable speed.

Figure 8:
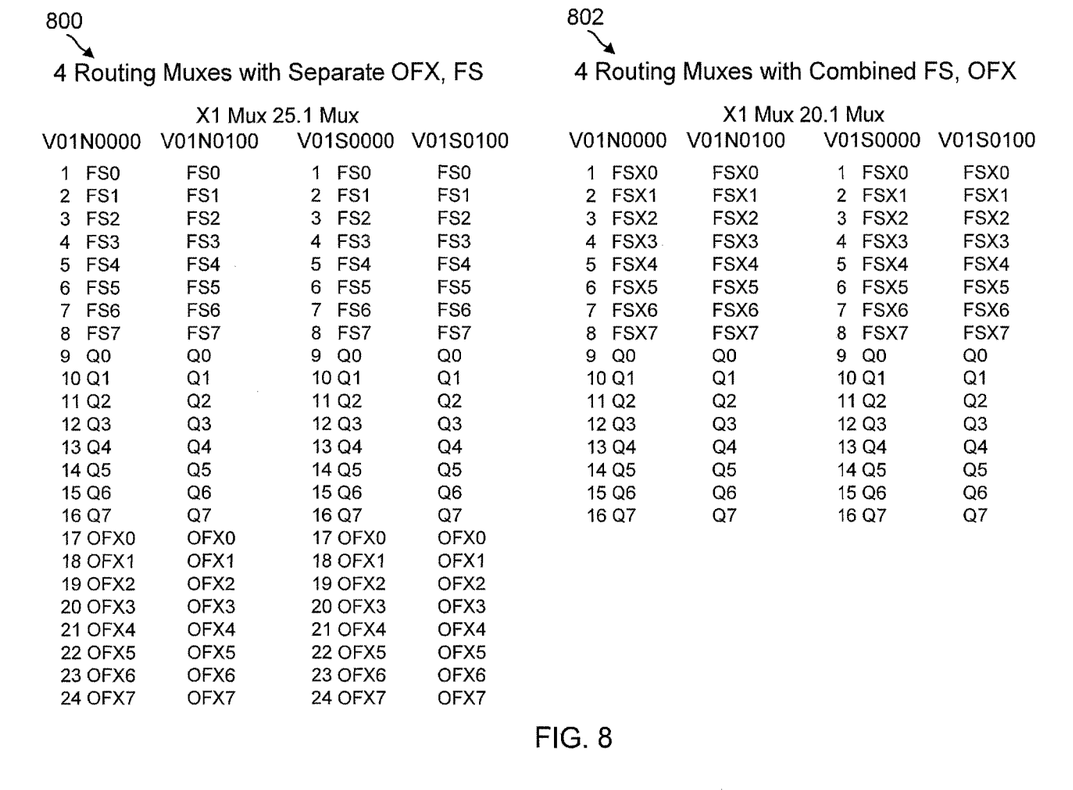
FIG. 8 illustrates two tables for comparison of required routing resources in accordance with an embodiment of the disclosure.

FIG. 8 illustrates two tables for comparison of required routing resources in accordance with an embodiment of the disclosure. More particularly, FIG. 8 shows an example of how muxs in routing resources 180 are affected by the number of ports in a PLB. On the left side is a partial routing table 800 representing four 24:1 muxs where the OFX outputs are brought out separately from the FS outputs. On the right side is the equivalent (yet smaller) partial routing table 802 representing four 16:1 muxs where the OFX outputs are combined with the FS outputs. In various embodiments, a smaller mux will be faster than a larger mux, consume less area, consume less power, require fewer configuration bits, and reduce wiring and wire loads.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device (PLD), comprising:
a plurality of programmable logic blocks (PLBs); and
at least first and second logic cells within at least one of the plurality of PLBs, each logic cell comprising a lookup table (LUT) and associated mode logic configured to receive a LUT output signal from the LUT, wherein:
the associated mode logic is configured to use a single physical output port to provide a logic cell output signal from its respective logic cell corresponding to an operational mode selected from a logic function operational mode, a ripple arithmetic operational mode, and an extended logic function operational mode;
when the selected operational mode for the first logic cell comprises the logic function operational mode, the associated mode logic for the first logic cell is configured to provide the LUT output signal of the first logic cell as the logic cell output signal on the single physical output port; and
when the selected operational mode for the first logic cell comprises the extended logic function operational mode, the associated mode logic for the first logic cell is configured to:
multiplex the LUT output signal of the first logic cell and the LUT output signal of the second logic cell, and
provide the multiplexed signal as a first logic cell output signal on the single physical output port of the first logic cell and to an input of the second logic cell.

2. The PLD of claim 1, wherein:
each logic cell comprises a ripple register and a generate register coupled to the associated mode logic;
the selected operational mode for each logic cell is determined by values of the respective ripple register and the respective generate register; and
the at least one of the PLBs comprises between two and sixteen logic cells.

3. The PLD of claim 1, wherein, for at least one logic cell:
the selected operational mode comprises the logic function operational mode; and
the propagation delay between the LUT output signal and the logic cell output signal provided by the associated mode logic corresponds substantially to the propagation delay of one passgate structure and/or one inverter.

4. The PLD of claim 1, wherein, for at least one logic cell:
the selected operational mode comprises the ripple arithmetic operational mode;
the associated mode logic comprises carry logic that is configured to receive a carry input signal, a generate signal, and/or the LUT output signal, and to provide a carry output signal; and
the LUT is configured to receive a value of a generate register and provide the generate signal to the associated mode logic.

5. The PLD of claim 1, wherein:
the selected operational mode for each logic cell comprises the extended logic function operational mode;
the LUT for each logic cell comprises a four input LUT (4-LUT); and
the first logic cell output signal comprises a 5-LUT output signal.

6. The PLD of claim 1, wherein:
the selected operational mode for each logic cell comprises the extended logic function operational mode;
the LUT for each logic cell comprises an N input LUT (N-LUT); and
the first logic cell output signal comprises an (N+1)-LUT output signal.

7. The PLD of claim 1, wherein:
the associated mode logic for each logic cell comprises three or four 2:1 multiplexers and/or is implemented without a 3:1 multiplexer; and
each logic cell comprises a programmable register configured to store the logic cell output signal or a logic cell input signal based on a value of a select register coupled to the programmable register.

8. The PLD of claim 1, wherein:
the physical output port for the first logic cell is hardwired to an input port for the second logic cell.

9. The PLD of claim 1, wherein the associated mode logic for the first logic cell comprises:
a first inverter structure and a passgate structure configured to receive the LUT output signal directly from the LUT; and
a second inverter structure configured to receive signals directly from the first inverter and the passgate and provide the logic cell output signal.

10. A method for programming the PLD of claim 1, comprising:
generating configuration data to configure physical components of the PLD in accordance with a synthesized design comprising at least one logic function operation, ripple arithmetic operation, and/or extended logic function operation that is implemented by at least the first and/or second logic cells; and
programming the PLD with the configuration data.

11. The PLD of claim 1, wherein, when the selected operational mode for the second logic cell comprises the extended logic function operational mode, the associated mode logic for the second logic cell is configured to provide a second logic cell output on the single physical output port of the second logic cell responsive to the LUT output signal of the second logic cell, the first logic cell output signal, and a logic cell output signal of a third logic cell.

12. A computer-implemented method comprising:
receiving a design identifying operations to be performed by a programmable logic device (PLD); and
synthesizing the design into a plurality of PLD components, wherein the synthesizing comprises:
detecting a logic function operation, a ripple arithmetic operation, and/or an extended logic function operation in the design; and
implementing the detected operation using first and/or second logic cells within a programmable logic block (PLB) of the PLD, each logic cell comprising a lookup table (LUT) and associated mode logic configured to receive a LUT output signal from the LUT, wherein:
the associated mode logic is configured to use a single physical signal output port to provide a logic cell output signal from its respective logic cell corresponding to an operational mode selected from a logic function operational mode, a ripple arithmetic operational mode, and an extended logic function operational mode;
when the selected operational mode for the first logic cell comprises the logic function operational mode, the associated mode logic for the first logic cell is configured to provide the LUT output signal of the first logic cell as the logic cell output signal on the single physical signal output port; and
when the selected operational mode for the first logic cell comprises the extended logic function operational mode, the associated mode logic for the first logic cell is configured to:
multiplex the LUT output signal of the first logic cell and the LUT output signal of the second logic cell, and
provide the multiplexed signal as a first logic cell output signal on the single physical signal output port of the first logic cell and to an input of the second logic cell.

13. The method of claim 12, further comprising:
placing the first and second logic cells in the PLD; and
routing connections to the first and second logic cells, wherein:
the routing comprises programming the associated mode logic to implement at least a portion, of the extended logic function operation with the first and second logic cells.

14. The method of claim 12, further comprising:
placing the first and second logic cells in the PLD;
routing connections to the first and second logic cells, wherein the routing comprises:
interchanging the selected operational modes of the first and second logic cells, and
reprogramming each LUT and/or the associated mode logic to account for the interchanging of the selected operational modes.

15. The method of claim 12, wherein each logic cell comprises a programmable register, the method further comprising:
placing the first and second logic cells in the PLD;
routing connections to the first and second logic cells, wherein the routing comprises:
interchanging the selected operational modes of the first and second logic cells to provide the programmable register along a signal path within the PLD, and
reprogramming each LUT, the associated mode logic, and/or one or more control registers to account for the interchanging of the selected operational modes and/or to program the programmable register to store a signal on the signal path.

16. The method of claim 12, wherein:
each logic cell comprises a ripple register and a generate register coupled to the associated mode logic;
the selected operational mode is determined by values of the ripple register and the generate register; and
the associated mode logic is configured to receive the LUT output signal and provide the logic cell output signal corresponding to the selected operational mode.

17. The method of claim 12, wherein for at least one logic cell:
the selected operational mode comprises the logic function operational mode; and
the propagation delay between the LUT output signal and the logic cell output signal provided by the associated mode logic corresponds substantially to the propagation delay of one passgate structure and/or one inverter.

18. The method of claim 12, wherein for at least one logic cell:
the selected operational mode comprises the ripple arithmetic operational mode;
the associated mode logic comprises carry logic that is configured to receive a carry input signal, a generate signal, and/or the LUT output signal, and to provide a carry output signal; and
the LUT is configured to receive a value of a generate register and provide the generate signal to the associated mode logic.

19. The method of claim 12, wherein, when the selected operational mode for the second logic cell comprises the extended logic function operational mode, the associated mode logic for the second logic cell is configured to provide a second logic cell output on the single physical signal output port of the second logic cell responsive to the LUT output signal of the second logic cell, the first logic cell output signal, and a logic cell output signal of a third logic cell.

20. A non-transitory machine-readable medium storing a plurality of machine-readable instructions which when executed by one or more processors of a computer system are adapted to cause the computer system to perform a computer-implemented method comprising:

routing connections to at least first and second logic cells of a programmable logic device (PLD), each logic cell comprising a lookup table (LUT) and associated mode logic configured to receive a LUT output signal from the LUT, wherein:

the associated mode logic is configured to use a single physical output port to provide a logic cell output signal from its respective logic cell corresponding to an operational mode selected from a logic function operational mode, a ripple arithmetic operational mode, and an extended logic function operational mode; and when the selected operational mode for the first logic cell comprises the logic function operational mode, the associated mode logic for the first logic cell is configured to provide the LUT output signal of the first logic cell as the logic cell output signal on the single physical output port when the selected operational mode for the first logic cell comprises the extended logic function operational mode, the associated mode logic for the first logic cell is configured to:

multiplex the LUT output signal of the first logic cell and the LUT output signal of the second logic cell, and provide the multiplexed signal as a first logic cell output signal on the single physical output port of the first logic cell and to an input of the second logic cell.

* * * * *